US007535646B2

(12) United States Patent
Chari et al.

(10) Patent No.: US 7,535,646 B2
(45) Date of Patent: May 19, 2009

(54) LIGHT EMITTING DEVICE WITH MICROLENS ARRAY

(75) Inventors: Krishnan Chari, Fairport, NY (US); Charles W. Lander, Wayland, NY (US); Jin-Shan Wang, Pittsford, NY (US); Donald R. Preuss, Rochester, NY (US); Ronald S. Cok, Rochester, NY (US); Yuan-Sheng Tyan, Webster, NY (US); Joel D. Shore, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 3 days.

(21) Appl. No.: 11/741,472

(22) Filed: Apr. 27, 2007

(65) Prior Publication Data

US 2008/0117519 A1 May 22, 2008

Related U.S. Application Data

(63) Continuation-in-part of application No. 11/561,244, filed on Nov. 17, 2006, now abandoned.

(51) Int. Cl.
*G02B 27/14* (2006.01)

(52) U.S. Cl. .......................................... 359/619

(58) Field of Classification Search .......... 359/619–626
See application file for complete search history.

(56) References Cited

U.S. PATENT DOCUMENTS

| | | | | |
|---|---|---|---|---|
| 4,476,292 | A | 10/1984 | Ham et al. | |
| 4,769,292 | A | 9/1988 | Tang et al. | |
| 5,247,190 | A | 9/1993 | Friend et al. | |
| 6,859,326 | B2 | 2/2005 | Sales | |
| 2003/0020399 | A1 * | 1/2003 | Moller et al. | 313/504 |
| 2004/0042198 | A1 | 3/2004 | Cok | |
| 2004/0189185 | A1 | 9/2004 | Yotsuya | |
| 2004/0211971 | A1 | 10/2004 | Takei et al. | |
| 2005/0023433 | A1 | 2/2005 | Ishitaka et al. | |

OTHER PUBLICATIONS

C. W. Tang et al; *Applied Physics Letter*; "Organic Electroluminescent Diodes"; vol. 51; No. 12; 1987; pp. 913-915.

C. W. Tang et al; *Journal Of Applied Physics*; "Electroluminescence Of Doped Organic Thin Films"; vol. 65; No. 9; 1989; pp. 3610-3636.

Huajun Peng et al; *Journal Of Display Technology*; "Coupling Efficiency Enhancement In Organic Light-Emitting Devices Using Microlens Array-Theory And Experiment"; vol. 1; No. 2; 2005; pp. 278-282.

(Continued)

*Primary Examiner*—Alicia M Harrington
(74) *Attorney, Agent, or Firm*—Andrew J. Anderson; Raymond L. Owens

(57) ABSTRACT

A light-emitting device, comprising: a light emitting element on a first side of a transparent substrate or cover through which light is emitted; and a microlens array on a second side, opposite to the first side, of the transparent substrate or cover though which light is emitted; wherein the microlens array comprises individual hemispherical shaped microlenses having a mean diameter of less than 20 micrometers and a mean microlens height to diameter ratio of greater than 0.30, and has a microlens area fill factor greater than 0.8.

10 Claims, 9 Drawing Sheets

1.0 µm 1.0 µm

OTHER PUBLICATIONS

S. Möller et al; *Journal Of Applied Physics*; "Improved Light Out-Coupling In Organic Light Emitting Diodes Employing Ordered Microlens Array"; vol. 91; No. 5; 2002; pp. 3324-3327.

Mohan Srinivasarao et al; *Reports*; "Three Dimensionally Ordered Array Of Air Bubbles In A Polymer Film"; vol. 292; 2001; pp. 79-83.

Hiroshi Yabu et al; *Langmuir*; "Simple Fabrication Of Micro Lens Arrays"; vol. 21; 2005; pp. 1709-1711.

"Fabrication of Microvessels and Microlenses from Polymers by Solvent Droplets" by Elmar Bonaccurso et al., Applied Physics Letters 86, 12, Mar. 14, 2005, pp. 124101, XP012064779.

* cited by examiner

LIGHT EMITTING DEVICE WITH MICROLENS ARRAY

CROSS REFERENCE TO RELATED APPLICATIONS

This application is a continuation-in-part of U.S. Ser. No. 11/561,244 filed Nov. 17, 2006, now abandoned the disclosure of which is incorporated by reference herein in its entirety.

FIELD OF THE INVENTION

This invention relates to a light-emitting device having a micro-lens array, and more particularly to self-emissive light-emitting devices having a high fill-factor micro-lens array in optical contact with a transparent substrate or cover of the light-emitting device, and a method of fabricating the high fill-factor micro-lens array.

BACKGROUND OF THE INVENTION

Light-emitting devices comprising self-emissive thin film light emitting elements such as organic light emitting diodes (OLEDs) represent an attractive technology for flat panel display and solid-state lighting. OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, a top transparent cathode layer, and a transparent encapsulating cover. Light generated from the device is emitted through the top transparent electrode and encapsulating cover. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions. Thus, it can be seen that a major shortcoming of OLEDs is that only a small fraction of light generated in the organic layers is emitted from the device. A significant amount of light is trapped by total internal reflection (TIR) because of the relatively large differences in refractive index at the anode-substrate and substrate-air interfaces.

Methods for improving the extraction or out-coupling of light from OLEDs are known in the art. A number of approaches have focused on the substrate-air interface. For example, Moller and Forrest (Applied Physics Letters, volume 91, page 3324, March 2002 incorporated here as reference) have demonstrated an increase in light output by a factor or 1.5 by attaching a micro-lens array to the glass substrate of an OLED. But there are significant problems with this approach. Preparation of the micro-lens array is by a complex multi-step process involving chemical vapor deposition, photolithography and chemical etching. Also, the micro-lenses do not have the optimum shape. Calculations by Peng et al. (Journal of Display Technology, volume 1, page 278, December 2005 incorporated here as reference) indicate that micro-lenses should have perfectly hemispherical shape for maximum light extraction. Peng et al. describe a process for fabrication of a micro-lens array based on coating a thin layer of photo-resist material on a glass substrate followed by patterning the photo-resist by conventional lithography and then modifying the shape of the photo-resist disks by melting and re-flow. Although the process is an improvement over the method of Moller and Forrest that is reflected in higher light extraction, a factor of 1.85 versus 1.5; there are still problems to be overcome. Melting and re-flow of the photo-resist is difficult to control resulting in significant deviations from hemispherical shape. Furthermore, the distance between lenses is fixed at 1 μm because a smaller spacing or higher resolution is difficult to obtain using this process that is characteristic of “top-down” or conventional micro-fabrication technology. The minimum spacing of 1 μm limits the area fill factor to less than 0.80 for a hexagonally close packed array of hemispherical micro-lenses having diameters of less than 20 micrometers, where the fill factor is defined as the ratio of the area occupied by the micro-lenses to the total area of the surface. Clearly, it is desirable to have a micro-lens array with fill factor close to unity to achieve maximum light extraction.

US2004/0189185 also teaches an OLED device with a micro-lens array. However, once again the micro-lens array is fabricated by conventional micro-fabrication methods such as wet etching and photo-resist re-flow that have the same disadvantages as noted above.

Yabu and Shimomura (Langmuir, volume 21, page 1709, 2005) describe an alternative approach for preparing micro-lens arrays. In this process, a solution of polymer in a volatile organic solvent is cast under humid conditions. Evaporation of the organic solvent under the same humid conditions followed by subsequent evaporation of condensed water droplets from the cast composition results in a polymer film containing a uniform closely packed three dimensional network of spherical pores. A close-packed array of pillar structures is then generated by peeling off the top layer of the film with spherical pores. A polymeric material is subsequently coated over the pillar structure, cured and then released to form a micro-lens array. Yabu and Shimomura do not quantify the fill factor or the shapes of the individual micro-lenses in the array. Furthermore, they do not discuss the effectiveness of the micro-array for light extraction from OLEDs. Also, fabrication of the array involves a large number of steps that may not be suitable for low-cost high volume manufacturing. A simple process requiring less number of steps leading to micro-lens arrays having a high fill factor and hemispherical shaped micro-lenses and the integration of such arrays with OLEDs is still needed. An additional problem with the micro-lens array of Yabu and Shimomura and other micro-lens arrays in the prior art is that the micro-lens array comprises a relatively precisely ordered, non-random array of lenses. An ordered array of lenses in an OLED display can cause significant diffractive artifacts from intense ambient point sources, such as sunlight, or incandescent lamps. It would be desirable to have OLED devices, and in particular pixelated display devices, with integrated micro-lens arrays wherein the lenses in the micro-lens arrays are close-packed but randomly distributed at the scale of a pixel.

Srinivasarao et al. (Science, volume 292, page 79, 2001) also describe a process for creating a micro-voided polymer film that involves casting a solution of polymer in a volatile organic solvent in the presence of moist air. Srinivasarao et al. indicate that the shape of the micro-voids in the polymer film depends on the density of the volatile organic solvent relative to water. A film with a three dimensional network of spherical pores as obtained by Yabu and Shimomura is formed if the solvent is less dense than water whereas a film containing only surface cavities is obtained if the solvent has a higher density than water. Srinivasarao mention polymers such as polystyrene containing an end-terminated carboxylic acid group, cellulose acetate and polymethylmethacrylate as being suitable polymers for forming the micro-voided polymer films but do not mention any specific properties to guide the selection of polymers. Furthermore, Srinivasarao et al. do not teach how the micro-voided polymer films are to be used for preparing micro-lens arrays for improved light extraction in OLEDs.

An object of this invention is to provide a light-emitting device, such as an OLED device, with a micro-lens array wherein the micro-lens array has a high fill factor of relatively small microlenses having hemispherical shape, wherein the microlens array is obtainable by a simple low-cost method and the light emitting device demonstrates high light output.

SUMMARY OF THE INVENTION

In accordance with one embodiment, the invention is directed towards a light-emitting device, comprising: a light emitting element on a first side of a transparent substrate or cover through which light is emitted; and a microlens array on a second side, opposite to the first side, of the transparent substrate or cover though which light is emitted; wherein the microlens array comprises individual hemispherical shaped microlenses having a mean diameter of less than 20 micrometers and a mean microlens height to diameter ratio of greater than 0.30, and has a microlens area fill factor greater than 0.8.

In accordance with a further embodiment, the invention is directed towards a method of manufacturing a micro-lens array and light-emitting device in accordance with the invention by 1) forming a solution of an organic soluble polymer along with a fluorocarbon surfactant in a volatile water-immiscible organic solvent having specific gravity greater than that of water,
2) casting the solution in a humid environment, and condensing water droplets on the cast solution,
3) evaporating off the solvent and condensed water droplets from the cast composition to create a first structured polymer film with hemispherical surface cavities having a mean diameter of less than 20 micrometers and a mean cavity depth to diameter ratio of greater than 0.30, and has a cavity area fill factor greater than 0.8,
4) coating a second fluid polymer composition over the first structured polymer film,
5) curing the second fluid polymer composition while it is still in contact with the first structured polymer film to render it solid and create a transparent second structured film comprising a first flat side and a second side with an array of microlenses formed thereon corresponding to the hemispherical cavities of the first structured film,
6) separating the second structured film with the micro-lens array from the first structured polymer film, and
7) attaching the flat side of the second structured film to a transparent substrate or cover of a light-emitting device though which light is emitted.

The required first structured polymer film with hemispherical cavities is formed directly upon evaporation of the organic solvent and condensed water droplets from the cast composition, and does not require additional steps as in prior art processes. Furthermore, a micro-lens array with the desired features in terms of fill factor and micro-lens shape is obtained from this micro-voided film in a straightforward manner.

In a specific embodiment of the invention, the microlens array is employed in a pixilated flat-panel display device, where the individual micro-lenses of the array are preferably relatively randomly distributed at the scale of a pixel in the display, such that the diffraction pattern observed when illuminating the micro-lens array with a beam of light exhibits one or more distinct rings, rather than individual bright points.

DETAILED DESCRIPTION

Figure 1A:
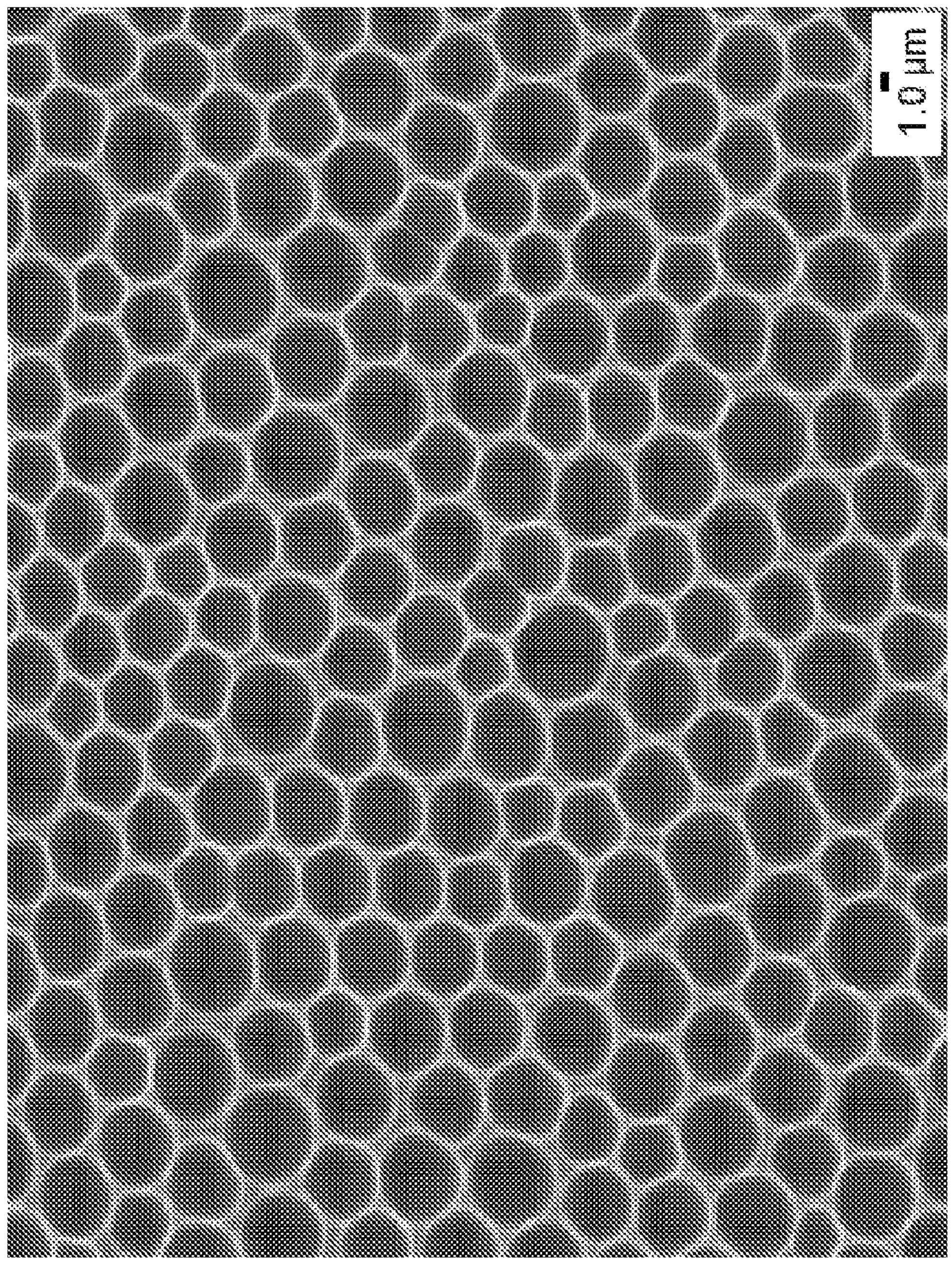
FIG. 1*a* is a photograph illustrating a first structured film having a high fill factor employed as a mold in an embodiment of the invention.

Microlens arrays as employed in the present invention may be formed by forming a solution of an organic soluble polymer with defined surface energy and wetting properties along with a fluorocarbon surfactant in a volatile water-immiscible organic solvent having density greater than that of water, casting this solution in a humid environment, evaporating off the solvent and condensed water droplets from the cast composition to create a first structured polymer film with hemispherical surface cavities, coating a second fluid polymer composition over the first structured polymer film, curing the second fluid polymer composition while it is still in contact with the first structured polymer film to render it solid and create a transparent second structured film comprising a first flat side and a second side with an array of microlenses formed thereon corresponding to the hemispherical cavities of the first structured film, wherein the solid material of the second structured film has a certain surface energy and refractive index, and separating the second structured film with the micro-lens array from the first structured polymer film. The resulting microlens array may then be attached to a transparent substrate or cover of a light emitting device through which light is emitted, such as an OLED device and in a particular embodiment a pixilated OLED display device, to form a device in accordance with the invention.

Suitable materials for the organic soluble polymer include polyethylene, polypropylene, polystyrene, polyacrylate, polyvinylchloride, cellulose acetate, polysulfone, polycarbonate, polycaprolactone, polymethylmethacrylate, polybutylmethacrylate, polyamide, polyisoprene, polyisobutylene, polyurethane and cellulose acetate butyrate. Mixtures of these polymers may also be used. It is preferred that the surface energy of the organic soluble polymer is greater than 30 dynes/cm and more suitably greater than 35 dynes/cm. Furthermore, it is preferred that the contact angle that a drop of water makes with the surface of the polymer is between 50 and 90 degrees and more suitably between 60 and 80 degrees. The molecular weight of the organic soluble polymer is suitably in the range of 20,000 to 500,000.

In accordance with the method of the invention, the organic soluble polymer is used in conjunction with a fluorocarbon surfactant. Fluorocarbon surfactants are a class of surfactants wherein the hydrophobic part of the amphiphile comprises at least in part some portion of a carbon-based linear or cyclic moiety having fluorines attached to the carbon where typically hydrogens would be attached to the carbons together with a hydrophilic head group. Some typical non-limiting fluorocarbon surfactants include fluorinated alkyl polyoxyalkylene and fluorinated alkyl esters as well as ionic surfactants.

Representative structures for these compounds are given below:

$$R_fR(R_1O)_xR_2 \quad \text{(I)}$$

$$R_fR\text{—}OC(O)R_3 \quad \text{(II)}$$

$$R_fR\text{—}Y\text{-}Z \quad \text{(III)}$$

$$R_fRZ \quad \text{(IV)}$$

wherein $R_f$ contains from 6 to about 18 carbons each having from about 0 to about 3 fluorines attached. R is either an alkyl or alkylene oxide group which when present, has from about 1 to about 10 carbons and $R_1$ represents an alkylene radical having from about 1 to 4 carbons. $R_2$ is either a hydrogen or a small alkyl capping group having from 1 to about 3 carbons. $R_3$ represents a hydrocarbon moiety comprising from about 2 to 22 carbons including the carbon on the ester group. This hydrocarbon can be linear, branched or cyclic saturated or unsaturated and may contain moieties based on oxygen, nitrogen and sulfur including, but not limited to ethers, alcohols, esters, carboxylates, amides, amines, thio-esters, and thiols; these oxygen, nitrogen and sulfur moieties can either interrupt the hydrocarbon chain or be pendant on the hydrocarbon chain. In the third structure above, Y represents a hydrocarbon group that can be an alkyl, pyridine group, amidopropyl, etc that acts as a linking group between the fluorinated chain and the hydrophilic head group. In the third and fourth structures, Z represents a cationic, anionic and amphoteric hydrophilic head group including but not limited to carboxylates, sulfates, sulfonates, quaternary ammonium groups and betaines. Non-limiting commercially available examples of these structures include Zonyl 9075, FSO, FSN, FS-300, FS-310, FSN-100, FSO-100, FTS and TBC from DuPont and Fluorad surfactants FC430, FC431, FC-740. FC-99, FC-120, FC-754, FC-170C and FC-171 from 3M in St. Paul, Minn.

Suitable solvents for the organic soluble polymer and the fluorocarbon surfactant are halogen based organic solvents such as chloroform, dichloromethane and dichloroethane; aromatic hydrocarbons such as benzene, toluene and xylene; esters such as ethyl acetate and butyl acetate; water insoluble ketones such as methyl isobutyl ketone; and carbon disulfide. The organic solvents may be used alone or in the form of a mixed solvent comprising a combination of two or more. In accordance with the method of the invention, to form hemispherical cavities only on the surface of the first structured film, the organic solvent has a specific gravity greater than 1.0 and more suitably greater than 1.2. Also, it is preferred that the boiling point of the organic solvent is less than 120 C at normal atmospheric pressure and more suitably less than 100 C. Furthermore, the latent heat of evaporation of the organic solvent is desirably greater than 200 kJ/kg and more desirably greater than 300 kJ/kg. It is also desired that the solubility of the organic solvent in water at room temperature is less than 5 g/100 mL and more suitably less than 2 g/100 mL.

The concentration of the organic soluble polymer in the organic solvent is suitably between 5 wt % and 40 wt % and the concentration of the fluorocarbon surfactant is most suitably less than 1.0 wt % based on the weight of the organic soluble polymer, preferably from 0.05 to 0.5% and more preferably 0.05 to 0.2% based on the concentration of polymer.

The cast solution of the organic soluble polymer and the fluorocarbon surfactant in the organic solvent is most suitably exposed to humid air in a humidity chamber where the relative humidity is controlled between 40 and 95%. After evaporation of the organic solvent and the condensed water droplets, the resulting hemispherical surface cavity structured polymer film preferably has a surface fluorine content between 2 and 20 atom % and more suitably between 3 and 10 atom %.

The use of a fluorocarbon surfactant, along with other material selections and process conditions in accordance with the above descriptions, has been found to be particularly effective for enabling formation of a first structured film having a high fill factor (greater than 80%, preferably greater than 85%) of relatively small (less than 20 micrometer, preferably 1-10 micrometer) hemispherical shaped cavities (having a mean cavity depth to diameter ratio of greater than 0.30, preferably greater than 0.35 and most preferably greater than 0.40) for use as a mold in forming a microlens array for use in the invention.

The second fluid polymer composition, used to form the microlens array film itself, is preferably an elastomer such as polydimethylsiloxane (PDMS) that may be cured after it has been spread over the first structured polymer film. A suitable material is Sylgard 184 from Dow Corning Corporation that is thermally cured. Alternatively, a PDMS composition that is cured by ultra violet (UV) radiation may be used. Other elastomers such as trimethylsiloxy terminated methylhydrosiloxane-dimethylsiloxane or methylhydrosiloxane-dimethylsiloxane or (methacryloxypropyl)methylsiloxane-dimethylsiloxane copolymers that are commercially available as VDT-731, HMS-301 and RMS-033 from Gelest, Inc. may also be used. Also suitable are photocurable perfluoropolyethers (PFPEs). It is desirable that the cured polymer material of the second structured film micro-lens array has surface energy less than 30 dynes/cm and more suitably less than 25 dynes/cm to enable it to be easily released from the first structured polymer film by peeling off and creation of a microlens array with individual lenses closely conforming to the tightly packed arrangement of the cavities of the first structured film employed as a mold. It is also desired that the surface properties of the micro-lens array material is such that a drop of water placed on it will have a contact angle in excess of 90 degrees. Furthermore, it is desired that the refractive index of the micro-lens array material is between 1.35 and 1.55 and more suitably between 1.4 and 1.55, so as to be closely matched to that of a transparent glass substrate or cover through which light is emitted from a light emitting device.

The described method enables formation of a second structured film having a first flat side and a second side having a high fill factor (greater than 80%, preferably greater than 85%) of relatively small (less than 20 micrometer, preferably 1-10 micrometer) hemispherical shaped microlenses (having a mean height to diameter ratio of greater than 0.30, preferably greater than 0.35, and most preferably greater than 0.40), corresponding to the cavities formed in the first structured film mold.

Figure 5:
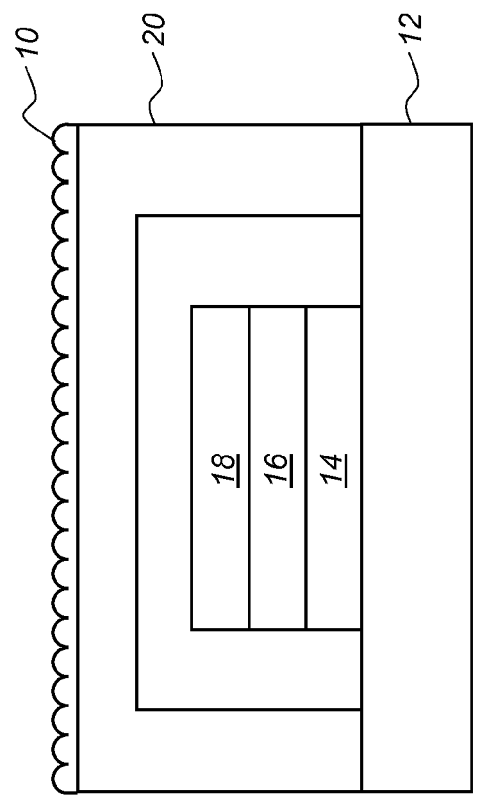
FIG. 5 is a diagram of a top-emitting OLED with a microlens array in accordance with an embodiment of the invention.
Figure 4:
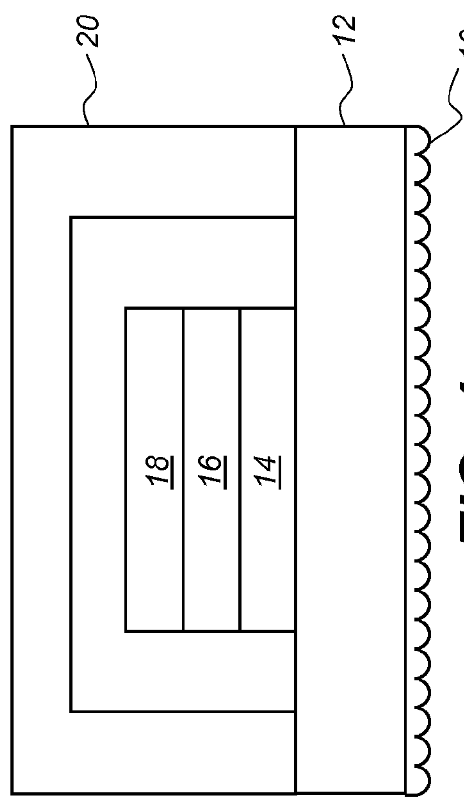
FIG. 4 is a diagram of a bottom-emitting OLED with a microlens array in accordance with an embodiment of the invention.

The microlens array of the second structured film formed in the method of the present invention can be integrated into a light-emitting device such as a flat-panel pixelated display by adhering the flat side of the second structured film to either a transparent cover or substrate of the flat-panel display through which light is emitted. In a preferred embodiment, the light-emitting element is an OLED comprising first and second electrodes and one or more layers of organic light-emitting material formed between the electrodes, wherein at least one electrode comprises a transparent electrode and is positioned between the organic layers and the transparent substrate or cover through which light is emitted. As shown in FIG. 4, a bottom-emitting flat-panel OLED display includes a transparent substrate 12, a transparent first electrode 14, one or more layers of organic light-emitting material 16, a second electrode 18, and an encapsulating cover 20 for the OLED display. On the opposite side of the transparent substrate 12, the microlens array film 10 is adhered. As shown in FIG. 5, a top-emitting OLED display includes a substrate 12, a first electrode 14, one or more layers of organic light-emitting material 16, a transparent second electrode 18, and a transparent encapsulating cover 20 for the OLED display. On the opposite side of the transparent cover 20, the microlens array film 10 is adhered. Preferably, the microlens array film is adhered to the transparent substrate or cover through which light is emitted with an optical adhesive having a relatively high refractive index.

In a specific embodiment of the invention, the microlens array is employed in a pixelated flat-panel display device, where the individual micro-lenses of the array are preferably randomly distributed at the scale of a pixel in the display. In accordance with such preferred embodiment, the invention advantageously enables production of microlenses in the second structured film that are close-packed, but also relatively disordered, or randomly distributed. The degree of disorder in the film is evident in the Fraunhofer diffraction pattern that is exhibited by the film when the film is placed before a source of laser light. The diffraction patterns exhibited by films of the invention embodied with relatively randomly distributed microlenses exhibit one or more distinct rings when illuminating the micro-lens array with a beam of light, whereas the diffraction patterns of films comprising an ordered array of lenses will be in the form of individual bright spots. The phenomenon of Fraunhofer diffraction is described more fully by Lisensky et al. Journal of Chemical Education, vol. 68, February 1991. The randomly distributed micro-lens array of such preferred embodiment of the present invention provides improved diffusion of ambient light when employed in a flat-panel display device. This is advantageous when concentrated intense light sources such as the sun or incandescent lamps are incident on the display. The specular reflections of such sources detract from the quality of the viewed image. Furthermore, the disordered nature of the microlenses in the present invention serves to minimize undesirable diffractive effects from such concentrated intense light sources, which create bright reflected spots or rings that are distracting to the viewer. When employed in a pixelated display device, it is important that the distribution of microlenses is random at the scale of a pixel in the display for the desirable effects of such embodiment of the invention to be apparent to the viewer. Pixel sizes in typical displays range, e.g., from about 50 μm×50 μm to 300 μm×300 μm.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

OLED devices can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat.

No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture. However, while the invention has been described primarily with respect to organic light emitting diode devices, it is not limited to such OLED devices, and may also be employed with other self-emissive light-emitting devices such as inorganic LEDs.

EXAMPLE 1

This example illustrates a method of preparation of a microlens array employed in accordance with an embodiment of the invention.

Figure 1B:
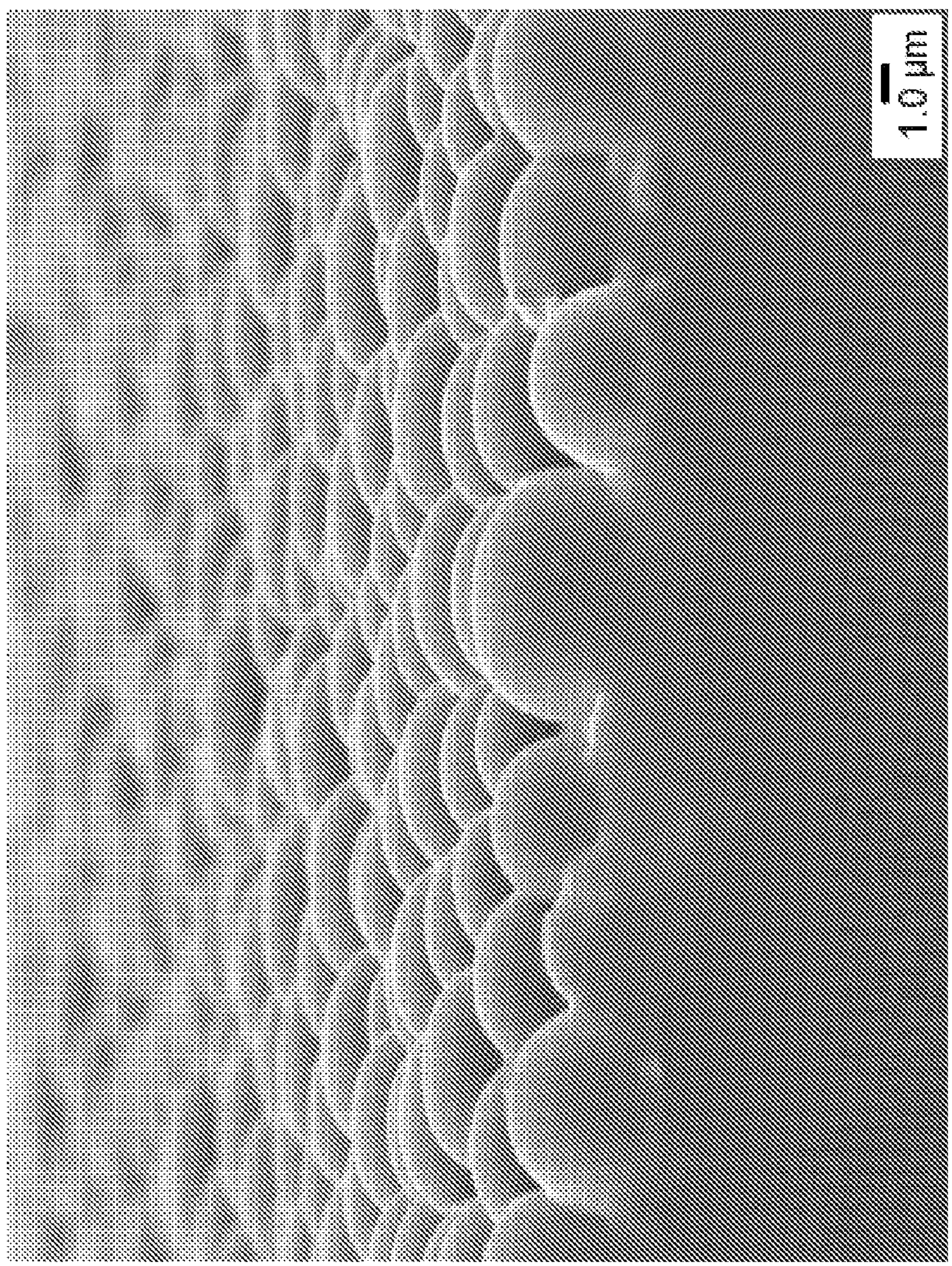
FIG. 1*b* is a photograph illustrating a structured film having a high hemispherical microlens fill factor employed in an embodiment of the invention.

A solution containing 23.8 wt % polycarbonate (Bayer DPI 1265; surface energy 46 dynes/cm and aqueous contact angle of 70°) and 0.1% FC431 fluorocarbon surfactant (based on the weight of polycarbonate) in dichloromethane (specific gravity 1.33, boiling point 40 C at normal atmospheric pressure, water solubility of 1.3 g/100 mL at 20 C and latent heat of evaporation of 406 kJ/kg) was applied on the surface of a sheet of polyethyleneterephthalate (PET) at a coverage of 452 $cm^3/m^2$. The wet coating was then immediately inserted into a closed chamber where the temperature and humidity were controlled at 22 C and 85% RH and kept there for 5 minutes. After evaporation of the organic solvent, the sheet was kept in the chamber for an additional 5 minutes and the chamber was purged with nitrogen gas to remove residual water. The resulting dried polymer film was then peeled off the PET substrate. The dried film, as illustrated in FIG. 1*a*, was structured with closely packed hemispherical cavities formed in the top surface thereof, with the hemispherical surface cavities having a mean diameter of approximately 4.3 micrometers and a mean cavity depth to diameter ratio of approximately 0.45, and had a cavity area fill factor greater than 0.8. Analysis of the structured polymer film by X-ray Photoelectron Spectroscopy (XPS) indicated that the surface of the film was composed of 76% carbon atoms, 18% oxygen atoms, 5% fluorine atoms. Sylgard 184 silicone elastomer base (from Dow Corning Corporation) was combined with Sylgard curing agent (also from Dow Corning) in a 10:1 weight ratio. The mixture was applied at a coverage of 151 $cm^3/m^2$ to the surface of the hemispherical cavities structured polymer film at 22 C. The elastomer was then cured in contact with the mold by heating to 100 C for one hour. The cured elastomer film (with surface energy of 23 dynes/cm, aqueous contact angle of 105° and refractive index of 1.41) with the imprint of the mold was released from the mold by peeling off. The resulting micro-lens array, as illustrated in FIG. 1*b*, was then characterized. The mean diameter of the micro-lenses was found to be close to 4.3 μm with a range of 3.5 to 5.1 μm and the average ratio of the height to the diameter of the micro-lenses was close to 0.45 with a range of 0.38 to 0.51 (a ratio of 0.5 corresponds to exact hemispherical shape). The array had a fill factor close to 0.88.

An OLED device with micro-lens array was constructed by optically coupling the micro-lens array to the glass substrate of a bottom emitting white OLED device comprising a 0.7 mm thick glass substrate, an 180 nm thick layer of transparent conducting oxides, a 2 nm thick hole injection layer, a 65 nm thick hole transport layer, 20 nm thick emission layers, a 90 nm thick electron transport layer and a 100 nm thick silver cathode. At a current density of 40 $mA/cm^2$, the device exhibited an external quantum efficiency of 2.72% photon/electron and a brightness of 4049 $lumen/m^2$. The same device without the micro-lens array exhibited an external quantum efficiency of 1.31% photon/electron and a brightness of 2051 $lumen/m^2$. Comparing the performance of the two devices, it is clear that the invention demonstrates significantly increased light output (by a factor of 2.1) over the control device.

EXAMPLE 2

Figure 2:
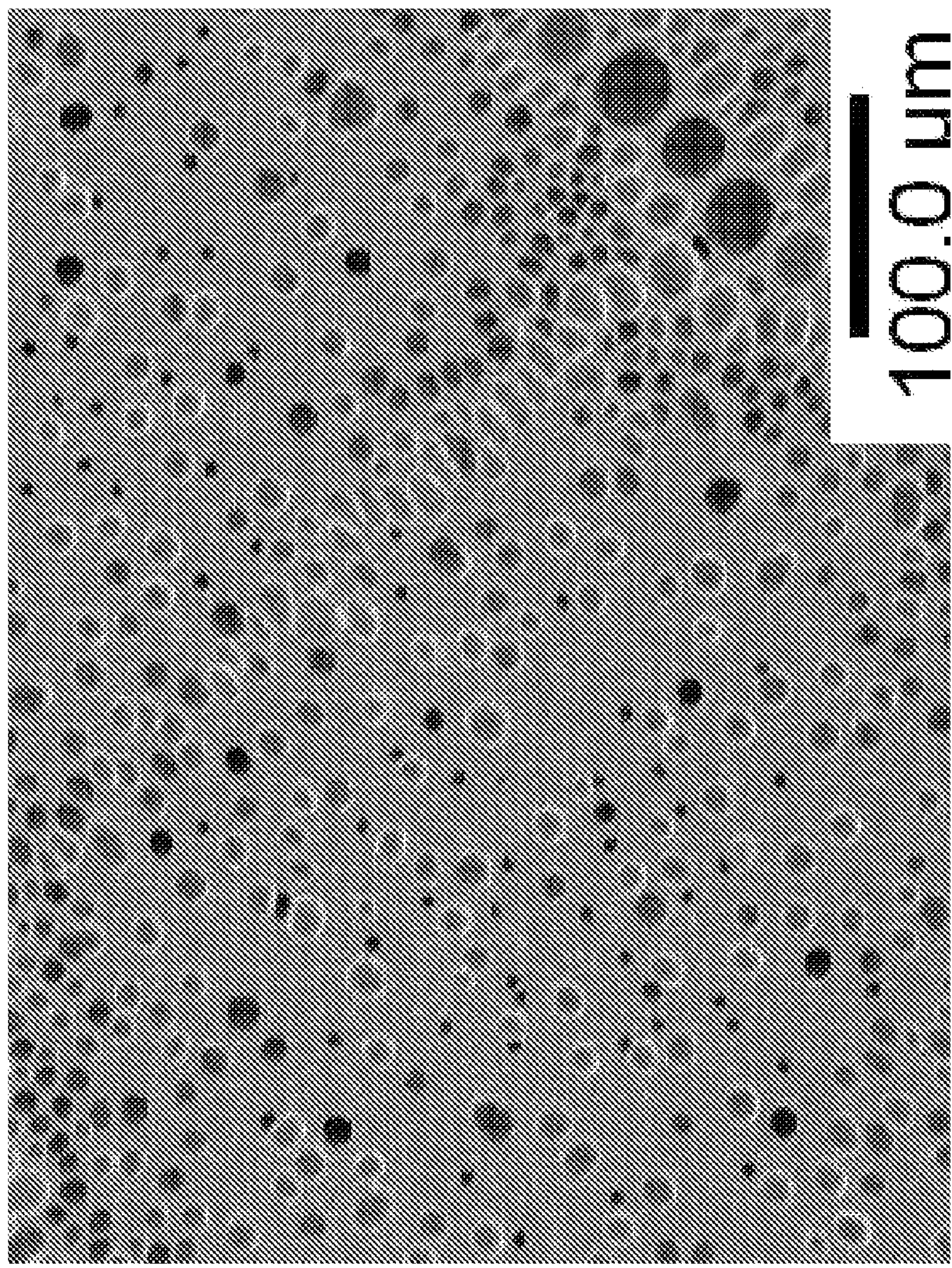
FIG. 2 is a photograph illustrating a comparison structured film.

A micro-voided polymer film was prepared in the same manner as described in example 1 except that the solution that was cast on the sheet of PET did not contain any fluorocarbon surfactant FC431. As illustrated in FIG. 2, it was found that a film with a closely packed population of micro-voids was not obtained in this case and the fill factor was only about 30%. It is clear that use of the fluorocarbon surfactant in accordance with the method of the present invention enables formation of a micro-array with high fill factor and hemispherical shaped micro-lenses suitable for obtaining enhanced light output in OLED devices.

EXAMPLE 3

A solution containing 39.7 wt % polycarbonate (Bayer DPI 1265) and 1.0% FC431 (based on the weight of polycarbonate) in dichloromethane was applied to the surface of PET at the same coverage as in example 1, and a first structured film with surface cavities was prepared in the same manner as before. Examination of the film by optical microscopy revealed that the higher level of surfactant resulted in relatively shallower cavities, with an estimated average cavity depth to diameter ratio of less than 0.3.

Figure 3:
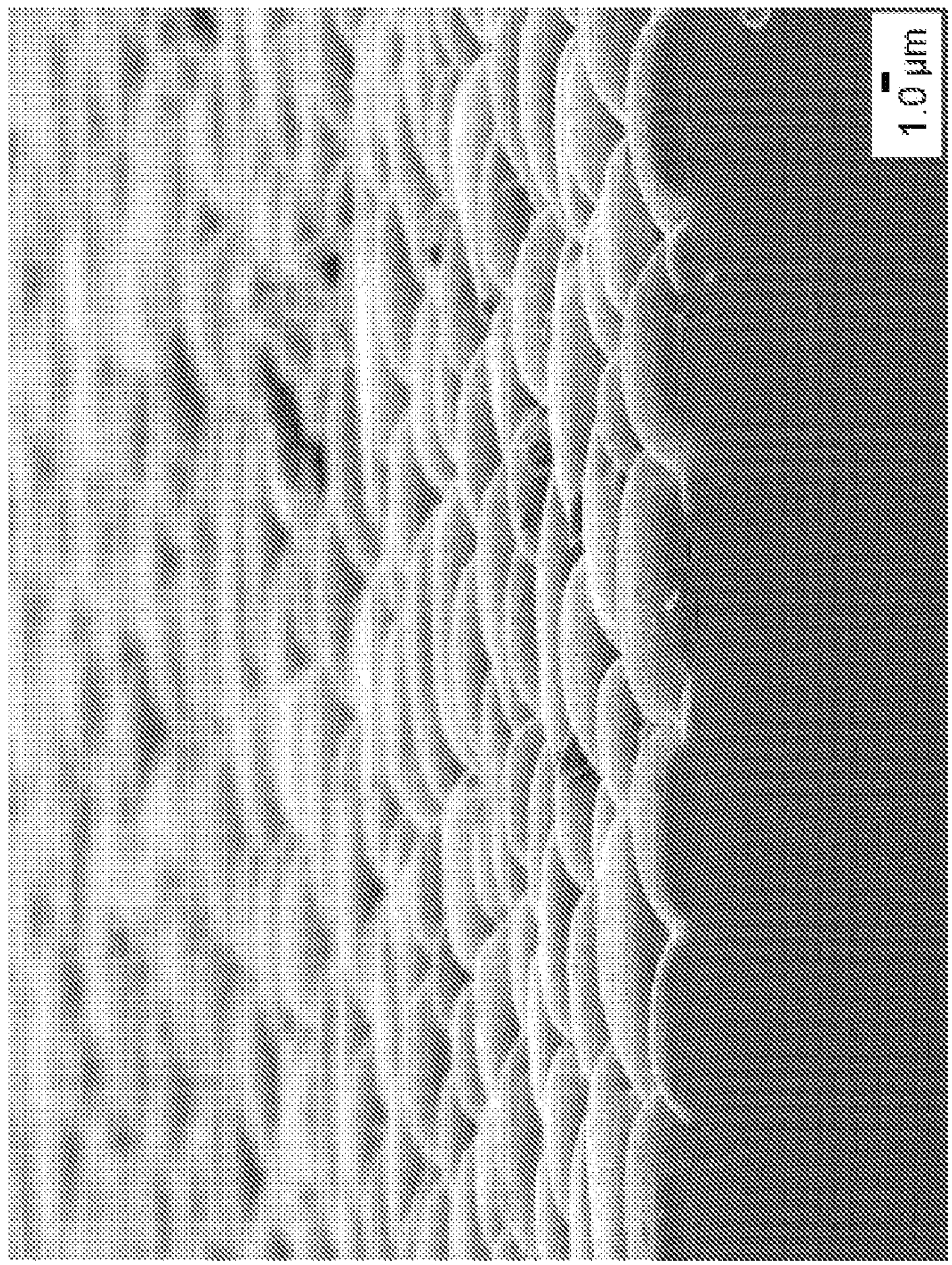
FIG. 3 is a photograph illustrating a comparison structured film having relatively flat microlenses.

Sylgard 184 elastomer was combined with curing agent and applied over the first structured film in the same manner as described in example 1. The cured elastomer film was then released from the mold to create a micro-lens array as illustrated in FIG. 3, with an estimated average lens height to diameter ratio of less than 0.3. Comparing optical micrographs of this micro-lens array with the micro-lens array resulting from the process of example 1, it is clear that the micro-lenses in this case have a significantly lower height to diameter ratio.

When this micro-lens array was optically coupled to the same OLED device as in example 1, an external quantum efficiency of 2.54% photon/electron was obtained at a current density of 40 $mA/cm^2$. Accordingly, it is clear that microlens arrays with a high fill factor of hemispherical microlenses in accordance with the invention provide greater light extraction efficiency.

EXAMPLE 4

The degree of order in the micro-lens array film prepared in Example 1 was characterized by placing the film in front of a laser beam (wavelength 632 nm, beam diameter 1.5 mm). The diffraction pattern shown in FIG. 6 was observed on a screen placed at a distance of 52 mm directly behind the film. The radius of the ring in the diffraction pattern was close to 9 mm.

The relation between the degree of order of a two-dimensional array and the resulting diffraction pattern can be studied by numerically simulating the diffraction of light from two-dimensional arrays of point particles in the plane. For light of wavelength $\lambda$ incident on a two-dimensional array of point particles at positions $x_j$ in the x-y plane, the resulting intensity on a flat screen in the far-field at a polar angle $\theta$ and an azimuthal angle $\phi$ is given by $$I(\theta, \phi) \sim \left|\sum_j \exp(-ik \cdot x_j)\right|^2 \cos^3(\theta)$$

where $k \equiv (2\pi/\lambda)(\sin[\theta]\cos[\phi], \sin[\theta]\sin[\phi], \cos[\theta])$ and $i \equiv \sqrt{(-1)}$.

Figure 7A:
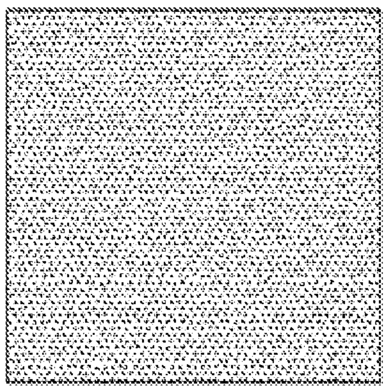
FIGS. 7*a*-7*f* illustrate simulated diffraction patterns from relatively ordered and disordered structured arrays.
Figure 7B:
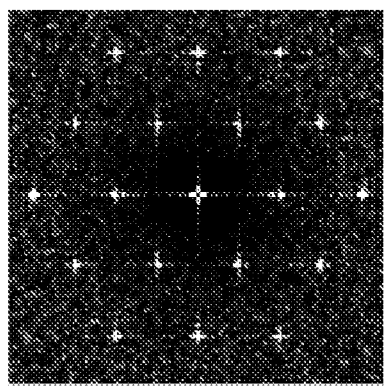
Figure 7C:
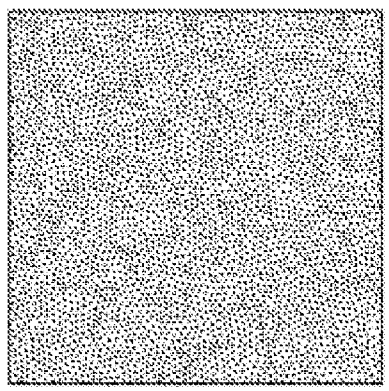
Figure 7D:
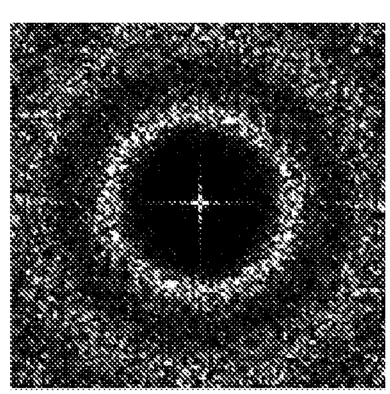
Figure 7E:
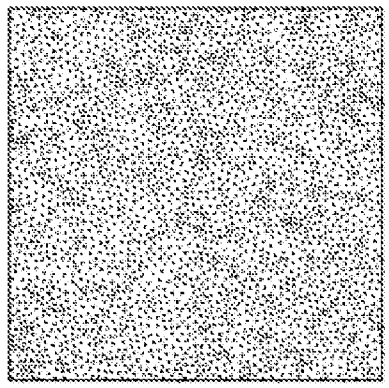
Figure 7F:
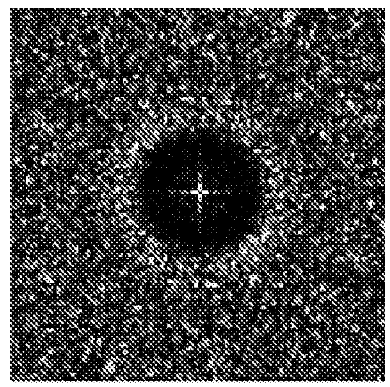

FIGS. 7*a*-7*f* compare three different two-dimensional arrays of point particles shown in FIGS. 7*a*, 7*c*, and 7*e* with the corresponding computed diffraction patterns shown in FIGS. 7*b*, 7*d*, and 7*f*, respectively. FIG. 7*a* is an ordered array produced by placing point particles on a regular triangular lattice and then perturbing each by a small random displacement. Note that the resulting diffraction pattern in FIG. 7*b* shows the distinct bright peaks arranged in a pattern having hexagonal symmetry. Such individual distinct peaks are characteristic of a diffraction pattern of an ordered array.

FIG. 7*c* is a random array produced by a Monte Carlo simulation that places the particles randomly in the plane subject to certain constraints regarding the allowed range of distances to the next closest particle. Note that the resulting diffraction pattern in FIG. 7*d* no longer shows distinct bright peaks arranged in a regular pattern but instead shows concentric bright rings. This is indicative of a random array in accordance with preferred embodiments of the microlens arrays employed in the invention.

Finally, FIG. 7*e* is a random array produced analogously to FIG. 7*c* except with a larger range of allowed distances between the nearest-neighbor particles. It thus displays a higher degree of disorder than the array above it. The resulting diffraction in FIG. 7*f* shows only one distinct ring and it is less distinct than in the diffraction pattern of FIG. 7*d*. This is indicative of a random array having a higher degree of disorder, also in accordance with preferred embodiments of the microlens arrays employed in the invention.

Figure 6:
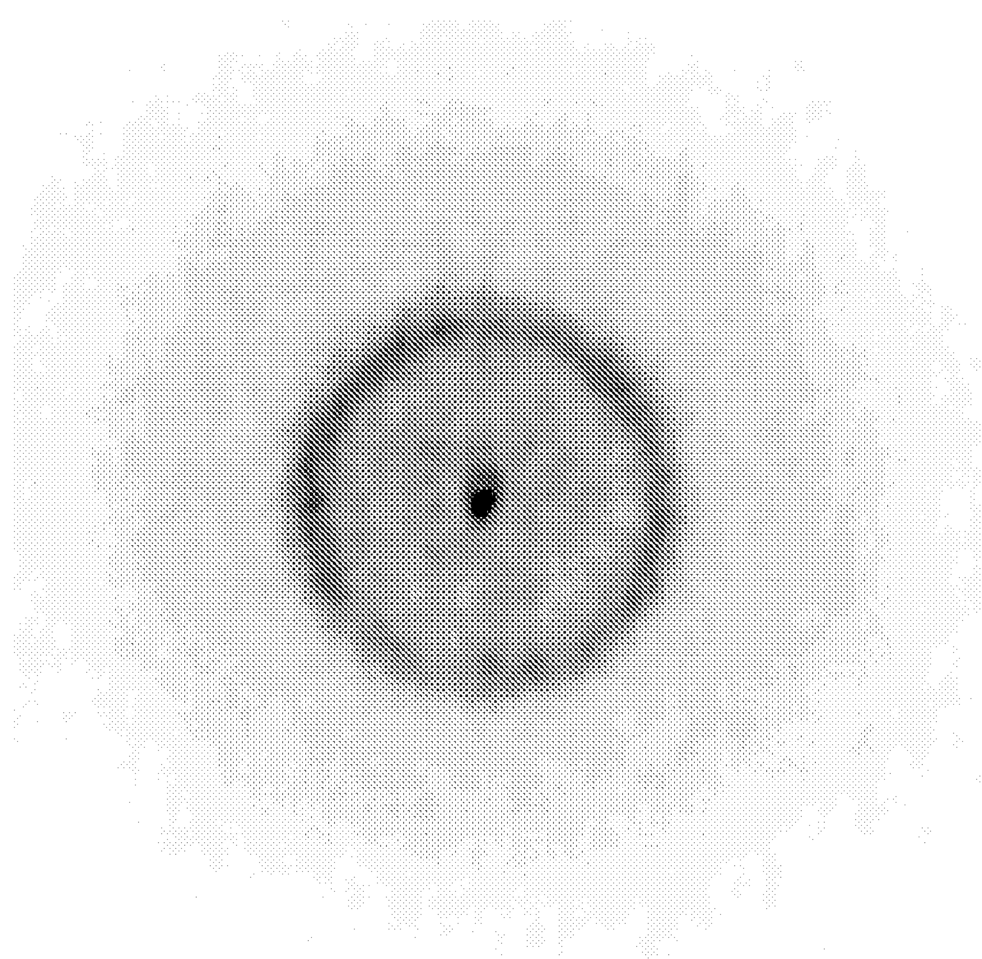
FIG. 6 is a photograph of a diffraction pattern exhibited by a second structured film employed in an embodiment of the invention.

By comparing the diffraction pattern seen for actual microlens arrays to these simulated diffraction patterns, the degree of randomness of the array can be estimated. For example, the array shown in FIG. 6 is clearly a random array as demonstrated by the ring diffraction pattern. As further can be seen from the illustrations of FIGS. 7*a*-7*f*, for applications in which a uniform distribution of light is desirable, the random arrays of lenslets according to preferred embodiments of the present invention provides a further advantage over the prior art.

EXAMPLE 5

Figure 8A:
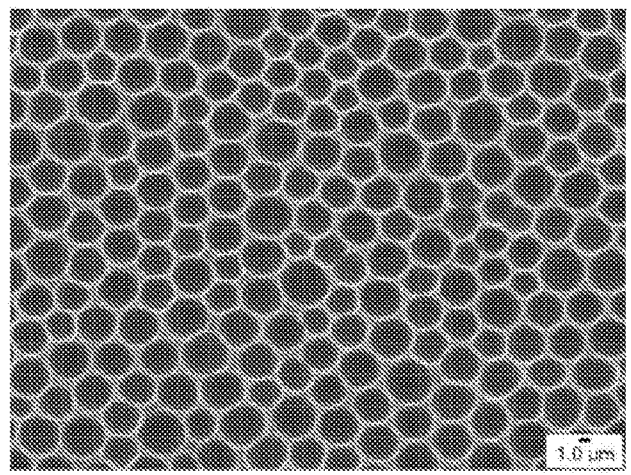
FIGS. 8*a*-8*c* illustrate a simulated diffraction pattern from the relatively disordered random array of the microlens array film prepared in Example 1.
Figure 8B:
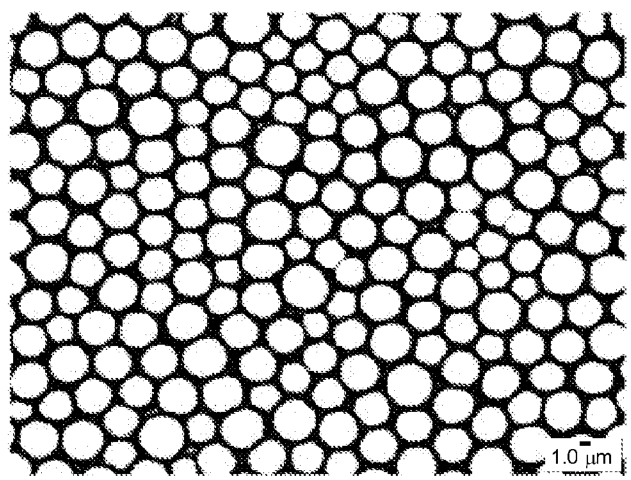
Figure 8C:
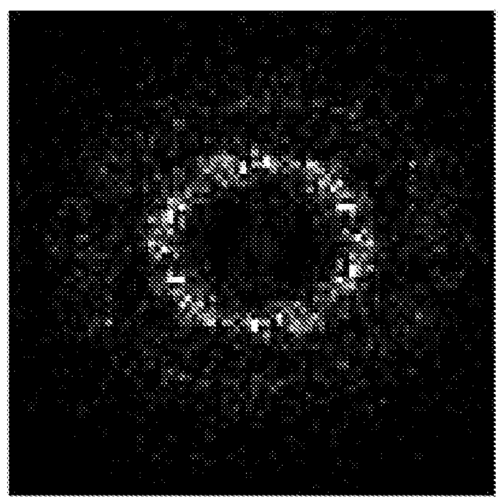

A photomicrograph of the micro-lens array film prepared in Example 1 is shown in FIG. 8*a*. From this image, an image detection program was used to produce the "abstracted" image shown in FIG. 8*b*. This is a binary image with each pixel having the value of 1 (white) representing the presence of a microlens at that point in the plane and each pixel having the value of 0 (black) representing the absence of a microlens. Finally, in FIG. 8*c*, we show the square magnitude of the two-dimensional discrete Fourier transform of the binary image shown in FIG. 8*b*. This numerically simulates the diffraction pattern that would be produced if monochromatic light were incident on the structure. Like the actual experimental diffraction pattern shown in FIG. 6, a ring-like structure is observed. This shows that even on the scale of this image (~40 μm×55 cm), the structure of the array already has a large degree of randomness at the scale of a typical display pixel size, and accordingly is what is considered to be a random array in accordance with preferred embodiments of the invention.

Figure 9A:
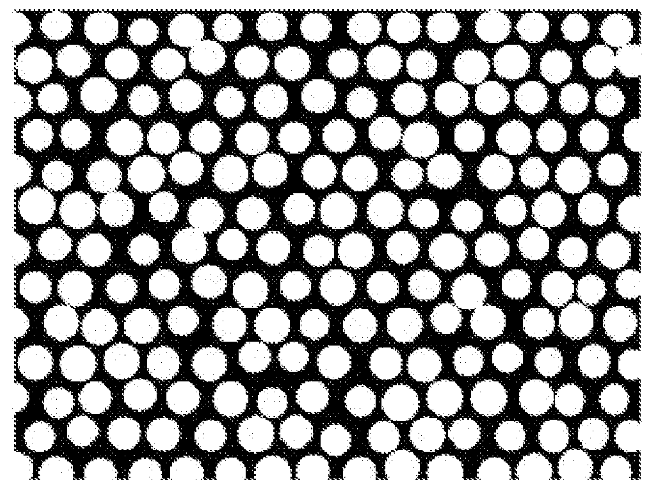
FIGS. 9*a*-9*c* illustrate a simulated diffraction pattern from a relatively ordered non-random structured array.
Figure 9B:
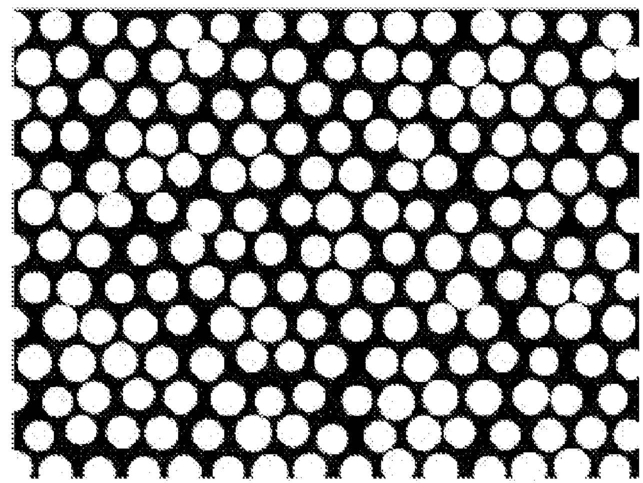
Figure 9C:
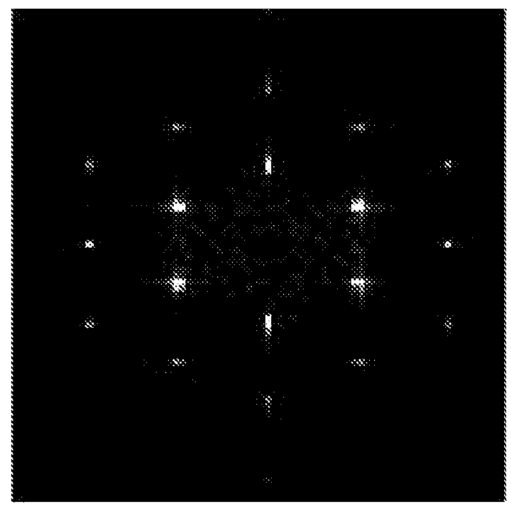

As a comparison, FIGS. 9*a*-9*c* follow a similar procedure starting in FIG. 9*a* with a simulated image that is meant to represent an ordered microlens array of the prior art. The image actually consists of an array of discs (representing microlenses) that are first placed in an ordered triangular array and then each perturbed by a small random displacement. Furthermore, the discs also have some random distribution of radii. Because this array was synthetically produced, the binary image produced from this image, shown in FIG. 9*b*, exactly duplicates the original image. Finally, in FIG. 9*c*, we show the numerically-simulated diffraction pattern represented by the square magnitude of the two-dimensional discrete Fourier transform of the image. Note that this diffraction pattern shows distinct bright peaks arranged in a pattern having hexagonal symmetry. Such peaks are characteristic of an ordered array. Despite the fact that there is some limited degree of randomness in both the position and size of the microlenses in the array, this array itself is considered to be essentially ordered and non-random as the diffraction pattern suggests.

The invention has been described in detail with particular reference to certain preferred embodiments thereof, but it will be understood that variations and modifications can be effected within the spirit and scope of the invention.

The invention claimed is:

1. A light-emitting pixellated flat-panel display device, comprising:

a light emitting element on a first side of a transparent substrate or cover through which light is emitted; and a microlens array on a second side, opposite to the first side, of the transparent substrate or cover though which light is emitted;

wherein the microlens array comprises individual hemispherical shaped microlenses having a mean diameter of less than 20 micrometers and a mean microlens height to diameter ratio of greater than 0.30, and has a microlens area fill factor greater than 0.8; and where the individual micro-lenses of the array are randomly distributed at the scale of a pixel in the display device, such that the diffraction pattern observed when illuminating the micro-lens array with a beam of light exhibits one or more distinct rings, rather than individual bright points.

2. A method of manufacturing a micro-lens array and light-emitting device according to claim 1, comprising 1) forming a solution of an organic soluble polymer along with a fluorocarbon surfactant in a volatile water-immiscible organic solvent having specific gravity greater than that of water, 2) casting the solution in a humid environment, and condensing water droplets on the cast solution, 3) evaporating off the solvent and condensed water droplets from the cast composition to create a first structured polymer film with hemispherical surface cavities having a mean diameter of less than 20 micrometers and a mean cavity depth to diameter ratio of greater than 0.30, and has a cavity area fill factor greater than 0.8, 4) coating a second fluid polymer composition over the first structured polymer film, 5) curing the second fluid polymer composition while it is still in contact with the first structured polymer film to render it solid and create a transparent second structured film comprising a first flat side and a second side with an array of microlenses formed thereon corresponding to the hemispherical cavities of the first structured film, 6) separating the second structured film with the microlens array from the first structured polymer film, and 7) attaching the flat side of the second structured film to a transparent substrate or cover of a light-emitting device though which light is emitted.

3. A method according to claim 2, wherein the organic soluble polymer has a surface energy of greater than 30 dynes/cm and wetting properties such that the contact angle that a drop of water makes with the surface of the polymer is between 50 and 90 degrees, and wherein the solid material of the second structured film has a surface energy of less than 30 dynes/cm and surface properties such that the contact angle tat a drop of water makes with the surface of the material is in excess of 90 degrees.

4. A method according to claim 3, wherein the organic soluble polymer has a surface energy of greater tan 35 dynes/cm and wetting properties such that the contact angle that a drop of water makes wit the surface of the polymer is between 60 and 80 degrees.

5. A method according to claim 4, wherein the solid material of the second structured film has a surface energy of less than 25 dynes/cm.

6. A method according to claim 2, wherein the first structured polymer film has a surface fluorine content between 2 and 20 atom %.

7. A method according to claim 2, wherein the first structured polymer film has a surface fluorine content between 3 and 10 atom %.

8. A method according to claim 2, wherein the first structured film is formed with hemispherical shaped cavities having a mean cavity depth to diameter ratio of greater than 0.35 and a cavity area fill factor of greater than 85%.

9. A method according to claim 2, wherein the first structured film is formed with hemispherical shaped cavities having a mean cavity depth to diameter ratio of greater than 0.40 and a cavity fill factor of greater than 0.85.

10. A method according to claim 2, wherein the first structured film is formed with hemispherical shaped cavities having a mean cavity diameter between 1 and 10 micrometers.

* * * * *